(12) United States Patent
Hsu et al.

(10) Patent No.: US 10,261,112 B2
(45) Date of Patent: Apr. 16, 2019

(54) NON-CONTACT TYPE VOLTAGE SENSOR FOR DUAL-WIRE POWER CABLE AND METHOD FOR COMPENSATING INSTALLATION POSITION VARIATION THEREOF

(71) Applicant: Industrial Technology Research Institute, Hsin-Chu (TW)

(72) Inventors: Wei-Hung Hsu, Taipei (TW); Shih-Hsien Cheng, Kaohsiung (TW); Pei-Fang Liang, Hsinchu County (TW); Lien-Yi Cho, Miaoli County (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 15/952,924

(22) Filed: Apr. 13, 2018

(65) Prior Publication Data

US 2018/0231586 A1 Aug. 16, 2018

Related U.S. Application Data

(62) Division of application No. 14/542,967, filed on Nov. 17, 2014, now Pat. No. 9,970,962.

(30) Foreign Application Priority Data

Sep. 16, 2014 (TW) .............................. 103131947 A

(51) Int. Cl.
*G01R 15/16* (2006.01)
*G01R 35/00* (2006.01)

(52) U.S. Cl.
CPC ........... *G01R 15/16* (2013.01); *G01R 35/005* (2013.01)

(58) Field of Classification Search
CPC .............................. G01R 15/16; G01R 35/005
See application file for complete search history.

(56) References Cited

U.S. PATENT DOCUMENTS

| 5,473,244 A | 12/1995 | Libove et al. |
| 6,642,705 B2 | 11/2003 | Kawase |

(Continued)

FOREIGN PATENT DOCUMENTS

| CA | 2814526 A1 | 11/2013 |
| CN | 1418312 A | 5/2003 |

(Continued)

OTHER PUBLICATIONS

State Intellectual Property Office of the People's Republic of China (SIPO), Office Action dated Jan. 3, 2018.

(Continued)

*Primary Examiner* — Stephen W Smoot
(74) *Attorney, Agent, or Firm* — WPAT, PC

(57) ABSTRACT

A voltage sensor and the method for compensating installation position variation thereof are disclosed. The voltage sensor may comprise a casing, two substrates, a plurality of voltage sensing units and an iterative operation unit. One side of the casing may include two grooves. The substrates may be respectively disposed in the grooves, and an accommodating space is formed between the substrates. The voltage sensing units may be disposed on the substrates to measure a plurality voltage parameters of a dual-wire power cable disposed in the accommodating space. The iterative operation unit can be disposed in the casing and connected to the voltage sensing units, wherein the iterative operation unit can perform an iterative operation process according to a compensation database and the voltage parameters for compensating the horizontal and vertical displacements (Continued)

occurring when installing the voltage sensor on the cable, and calculate the estimated input voltage of the cable.

9 Claims, 10 Drawing Sheets

(56) References Cited

U.S. PATENT DOCUMENTS

| | | | |
|---|---|---|---|
| 6,731,105 | B1 | 5/2004 | Hoyle et al. |
| 7,397,233 | B2 | 7/2008 | Sorensen |
| 8,319,491 | B2 | 11/2012 | Hammerschmidt |
| 8,476,895 | B2 | 7/2013 | Higuma et al. |
| 8,493,053 | B2 | 7/2013 | de Buda |
| 8,680,845 | B2 | 3/2014 | Carpenter et al. |
| 2002/0171433 | A1* | 11/2002 | Watanabe ............... G01R 15/16 324/539 |
| 2010/0194384 | A1 | 8/2010 | Hammerschmidt |
| 2011/0156723 | A1 | 6/2011 | Dorr et al. |
| 2012/0200291 | A1 | 8/2012 | Carpenter et al. |
| 2012/0215470 | A1 | 8/2012 | Maguire |
| 2013/0069664 | A1 | 3/2013 | Mogaveera |
| 2013/0106400 | A1 | 5/2013 | Cheng et al. |
| 2013/0293218 | A1 | 11/2013 | Levesque |
| 2014/0021965 | A1 | 1/2014 | De Rybel et al. |
| 2014/0028281 | A1 | 1/2014 | de Buda |
| 2014/0210453 | A1 | 7/2014 | El-Essawy et al. |
| 2014/0368221 | A1* | 12/2014 | Weinmann ............ G01R 15/142 324/658 |
| 2015/0177355 | A1 | 6/2015 | Cheng et al. |
| 2015/0331079 | A1 | 11/2015 | Kolwalkar et al. |

FOREIGN PATENT DOCUMENTS

| | | |
|---|---|---|
| CN | 1734386 | 2/2006 |
| CN | 102012446 A | 4/2011 |
| CN | 103384446 | 11/2013 |
| EP | 1199573 | 4/2002 |
| TW | 200629806 | 8/2006 |
| TW | I263050 | 10/2006 |
| TW | 201215898 | 4/2012 |
| TW | 201319605 | 5/2013 |
| WO | 2012130816 A1 | 10/2012 |

OTHER PUBLICATIONS

Gayan Wijeweera et al., "Micromachined Electric-Field Sensor to Measure AC and DC Fields in Power Systems", IEEE Transactions on Power Delivery, vol. 24, No. 3, Jul. 2009.

T. Kobayashi et al., "An Electrostatic Field Sensor Driven by Self-Excited Vibration of Sensor/Actuator Integrated", IEEE, Jan. 2012.

Chunrong Peng and Shanhong Xia, "A Novel Micro-Electrostatic Field Sensor Based on Parallel-Plate Resonator", IEE, Jan. 2009.

Chunrong Peng et al., "A Novel High Performance Micromechanical Resonant Electrostatic Field Sensor Used in Atmospheric Electric Field Detection", IEEE, Jan. 2006.

Yang et al., "A High Sensitivity SOI Electric-Field Sensor With Novel Comb-Shaped Microelectrodes", IEEE, Jun. 2011.

Taiwan Patent Office "Office Action" dated Oct. 2, 2015.

* cited by examiner

NON-CONTACT TYPE VOLTAGE SENSOR FOR DUAL-WIRE POWER CABLE AND METHOD FOR COMPENSATING INSTALLATION POSITION VARIATION THEREOF

CROSS-REFERENCE TO RELATED APPLICATION

This application is a divisional application of U.S. patent application Ser. No. 14/542,967 filed on Nov. 17, 2014 and claiming priority from Taiwan patent application 103131947 filed on Sep. 16, 2014.

BACKGROUND OF THE INVENTION

1. Field of the Invention

The present invention generally relates to a voltage sensor for dual-wire power cable, and more particularly, to a non-contact type voltage sensor for dual-wire power cable, which can compensate the vertical displacement and the horizontal displacement generated during the voltage sensor being installed on the dual-wire power cable by the iterative operation process in order to achieve "Install & Measure". The present invention further relates to the method for compensating installation position variation of the voltage sensor.

2. Description of the Related Art

Currently, owing to the awareness of the environmental protection, people pay more attention to how to save more energy. Thus, how to measure the electricity consumption, voltage and current of various household electric appliances has become an important issue. However, conventional voltage sensors still have some shortcomings to be overcome.

For example, the clamp-on voltage and current meter can be directly installed on the power cables of various household electric appliances to their electricity consumption, including voltage, current and watt; therefore, users can easily acquire the electricity consumption information of various household electric appliances in order to control the possible electricity consumption and achieve energy saving. However, the user should manually install the clamp-on voltage and current meter on the power cable; therefore, the installation position may vary with the manual operation of the user, which will result in measurement error. Accordingly, the power consumption information measured by the clamp-on voltage and current meter may be incorrect.

U.S. Pat. No. 8,680,845 discloses a non-contact current and voltage sensor, which can be directly installed on the power cables of various household electric appliances to measure their currents and voltages. The sensor can achieve "Install & Measure". However, it fails to provide a reliable calibration method to calibrate the errors due to the installation position variation caused by manual installation. Thus, the voltage and current measured by the sensor will always have errors.

U.S. Pat. No. 5,473,244 discloses an apparatus for measuring voltages and currents using non-contacting sensors, which can use the feedback signal to calibrate the measured current and voltage in order to improve its accuracy. However, the apparatus will still be influenced by the installation position variation, so the voltage and current measured by the apparatus are still inaccurate.

US patent Pub. No. 20140021965 discloses a high voltage measurement system, which takes the power cable to be measured as a part of the measurement system and uses the temperature compensation technique to enhance the accuracy of the measurement system. Similarly, it still fails to provide a reliable method to calibrate the errors due to the installation position variation caused by manual installation. Thus, the measurement result of the measurement system may still have some errors.

US patent Pub. No. 20130293218 discloses an optical sensor for non-contact voltage measurement, which uses an optical sensor to measure the optical signal which can represent the AC voltage of the power cable. However, it still fails to provide a reliable calibration method to calibrate the errors due to installation position variation caused by manual installation. Accordingly, the voltage and current measured by the sensor will always have errors.

TW patent Pub. No. 201319605 discloses a proximity current sensing apparatus, which allows the user to manually calibrate the errors due to installation position variation caused by manual installation. The apparatus can effectively calibrate the errors due to installation position variation caused by manual installation; however, the user should manually operate the apparatus to calibrate the errors due to the installation position variation caused by manual installation, which is very inconvenient for the user.

Therefore, it has become an important issue to provide a voltage sensor capable of solving the problem that the conventional voltage sensors cannot automatically calibrate the errors due to installation position variation caused by manual installation.

SUMMARY OF THE INVENTION

Therefore, it is a primary objective of the present invention to provide a non-contact type voltage sensor for dual-wire power cable and the method thereof in order to solve the problem that the conventional voltage sensors cannot automatically calibrate the errors due to installation position variation caused by manual installation.

To achieve the foregoing objective, the present invention provides a voltage sensor; the voltage sensor may comprise a casing, two substrates, a plurality of voltage sensing units and an iterative operation unit. The casing may comprise two grooves disposed on one side of the casing. The substrates may be disposed on the grooves respectively, and an accommodating space is formed between the substrates. The voltage sensing units may be disposed on the substrates for measuring a plurality of voltage parameters of a dual-wire power cable disposed in the accommodating space. The iterative operation unit may be disposed in the casing and connected to the voltage sensing units, wherein the iterative operation unit can perform an iterative operation process according to a compensation database and the voltage parameters for compensating a horizontal displacement and a vertical displacement generated during the voltage sensor being installed on the dual-wire power cable in order to calculate an estimated input voltage of the dual-wire power cable.

In a preferred embodiment of the present invention, the voltage sensor may further comprise a circuit board disposed in the casing, wherein, the iterative operation unit may be disposed on the circuit board and connected to the voltage sensing units via the circuit board.

In a preferred embodiment of the present invention, the grooves may be arranged to be parallel to each other.

In a preferred embodiment of the present invention, the casing may further comprise two positioning bumps disposed on one side of the grooves respectively, and the substrates may lean against the positioning bumps respectively.

In a preferred embodiment of the present invention, the voltage sensing units may comprise two first electrode pairs disposed on the substrates respectively in order to measure a vertical-direction voltage.

In a preferred embodiment of the present invention, the voltage sensing units may further comprise a second electrode pair and the electrodes of the second electrode pair may be disposed on the substrates respectively in order to measure a first horizontal-direction voltage.

In a preferred embodiment of the present invention, the voltage sensing units may further comprise a third electrode pair and the electrodes of the third electrode pair may be disposed on the substrates respectively in order to measure a second horizontal-direction voltage.

In a preferred embodiment of the present invention, the horizontal displacement may be the shortest distance between the substrates and the dual-wire power cable.

In a preferred embodiment of the present invention, the vertical displacement may be the distance between the substrates and the central horizontal cross-section of the dual-wire power cable.

To achieve the foregoing objective, the present invention further provides a method for compensating voltage sensor installation position variation; the method may comprise the following steps: measuring a plurality of voltage parameters of a dual-wire power cable; providing a plurality of compensation indicators for compensating a horizontal displacement and a vertical displacement generated during a voltage sensor being installed on the dual-wire power cable, wherein the compensation indicators provide pre-measurement values of the voltage parameters under different horizontal displacements and vertical displacements when a predetermined voltage is inputted into the dual-wire power cable; performing an iterative operation, whether the iterative operation calculates an estimated horizontal displacement according to an initial value of the vertical displacement, the voltage parameters and the compensation indicators, and calculates an estimated input voltage according to the initial value, the estimated horizontal displacement and the compensation indicators, and then calculates an estimated vertical displacement according to the estimated horizontal displacement, the voltage parameters, the estimated input voltage and the compensation indicators; and determining whether the estimated input voltage conforms to an iterative termination condition, wherein if the estimated input voltage conforms to the iterative termination condition, the iterative operation ends; if the estimated input voltage fails to conform to the iterative termination condition, the iterative operation continues until the estimated input voltage conforms to the iterative termination condition.

In a preferred embodiment of the present invention, the method may further comprise the following step: providing a vertical-direction voltage, a first horizontal-direction voltage and a second horizontal-direction voltage via the voltage parameters.

In a preferred embodiment of the present invention, the method may further comprise the following step: providing a horizontal displacement compensation indicator, a vertical displacement compensation indicator and an input voltage calibration indicator.

In a preferred embodiment of the present invention, the method may further comprise the following step: providing the pre-measurement values of the vertical displacement, the first horizontal-direction voltage, and the second horizontal-direction voltage under different horizontal displacements when the predetermined voltage is inputted into the dual-wire power cable according to the horizontal displacement compensation indicator.

In a preferred embodiment of the present invention, the method may further comprise the following step: providing the pre-measurement values of the horizontal displacement and the first horizontal-direction voltage under different vertical displacements when the predetermined voltage is inputted into the dual-wire power cable according to the input voltage calibration indicator.

In a preferred embodiment of the present invention, the method may further comprise the following step: providing the pre-measurement values of the horizontal displacement and the vertical-direction voltage under different vertical displacements when the predetermined voltage is inputted into the dual-wire power cable according to the vertical displacement compensation indicator.

In a preferred embodiment of the present invention, the method may further comprise the following step: terminating the iterative operation after the number of the iterative operation reaches a predetermined value.

The non-contact type voltage sensor for dual-wire power cable and the method for compensating installation position variation thereof according to the present invention have the following advantages:

(1) In one embodiment of the present invention, the voltage sensor can calculate the estimated input voltage closest to real input voltage of the dual-wire power cable via the iterative operation process; therefore, the errors due to the installation position variation caused by manual installation can be effectively compensated.

(2) In one embodiment of the present invention, the voltage sensor can automatically calibrate the errors due to the installation position variation caused by manual installation; therefore, users do not have to manually calibrate the errors, which is very convenient for the users.

(3) In one embodiment of the present invention, the voltage sensor can use the iterative operation process to calculate the estimated input voltage of the dual-wire power cable according to an iterative termination condition in order to make the estimated input voltage be close to the real input voltage of the dual-wire power cable; therefore, the accuracy of the voltage sensor can be effectively enhanced.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

The technical content of the present invention will become apparent by the detailed description of the following embodiments and the illustration of related drawings as follows.

Figure 1:
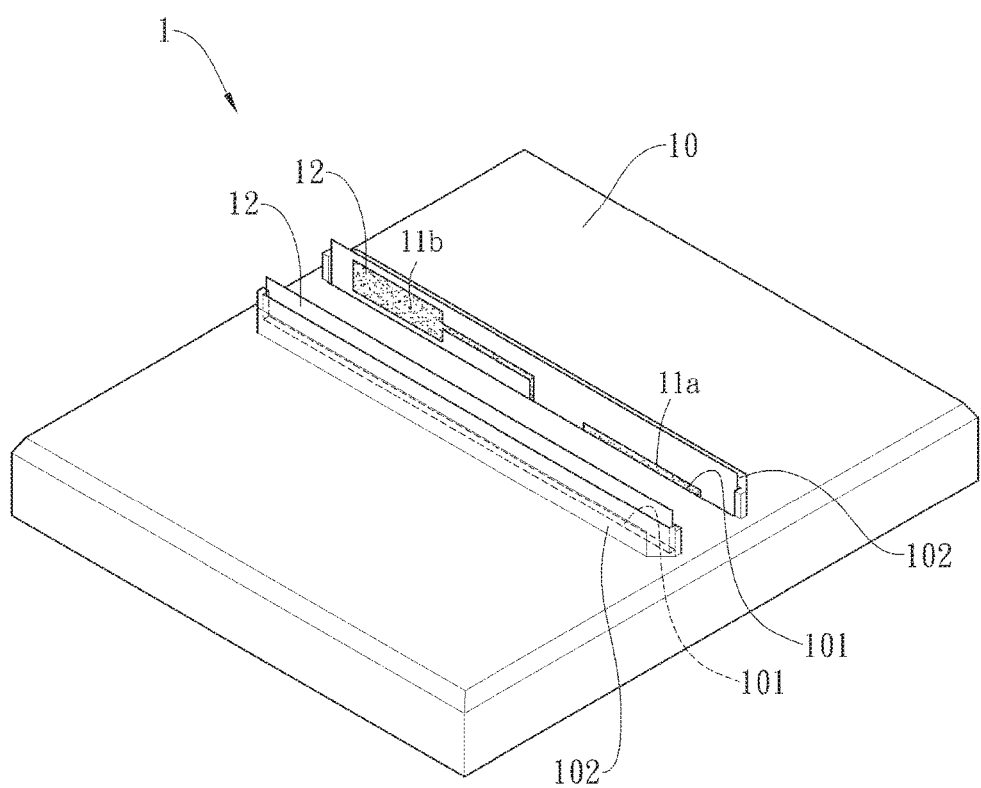
FIG. 1 is the first schematic view of the first embodiment of the non-contact type dual-wire power cable voltage sensor in accordance with the present invention.
Figure 2:
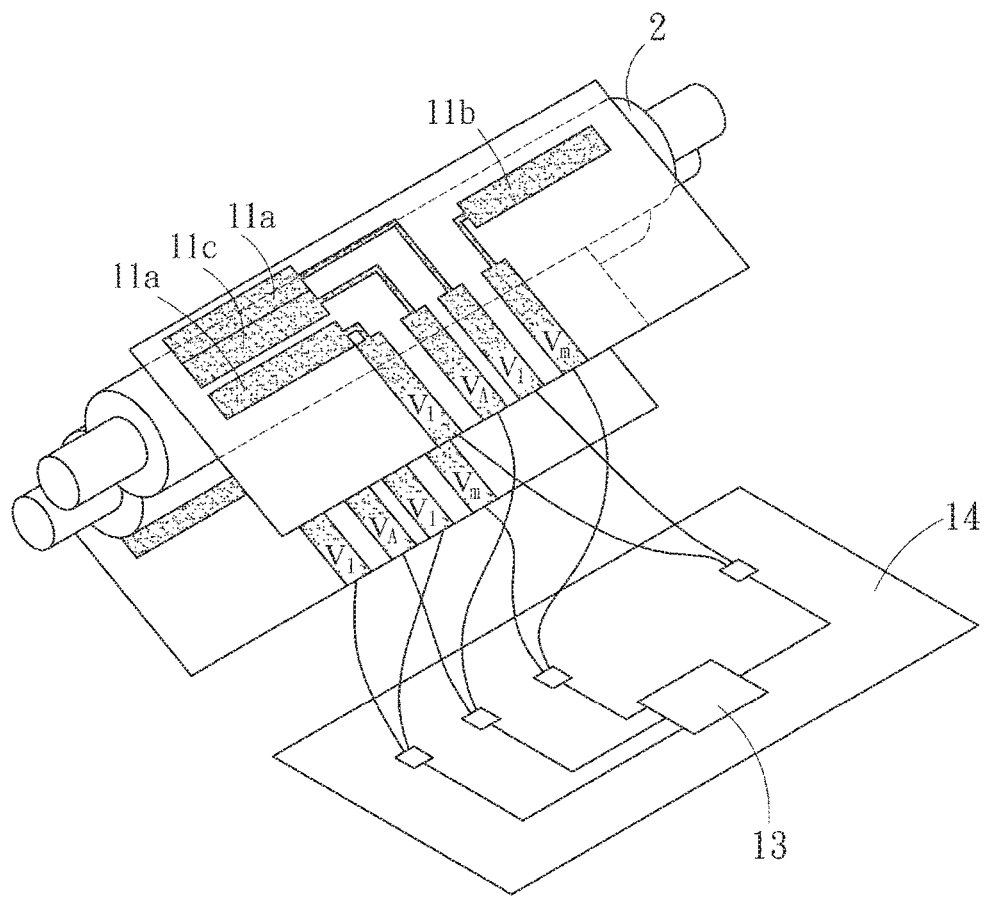
FIG. 2 is the second schematic view of the first embodiment of the non-contact type dual-wire power cable voltage sensor in accordance with the present invention.

Please refer to FIG. 1 and FIG. 2, which are the first and the second schematic views of the first embodiment of the non-contact type dual-wire power cable voltage sensor in accordance with the present invention. As shown in FIG. 1 and FIG. 2, the voltage sensor 1 comprises a casing 10, two substrates 12, a plurality of voltage sensing units and an iterative operation unit 13.

One side of the casing 10 comprises two grooves 101 arranged to be parallel to each other, and the two substrates 12 are disposed on the grooves 101 respectively to form an accommodating space between the substrates 12. The accommodating space can accommodate a dual-wire power cable 2 to be measured. One side of the casing 10 further comprises two positioning bumps 102, and each positioning bump 102 is disposed at one side of one of the grooves 101 and adjacent to the groove 101; the two substrates 12 lean against the positioning bumps 102 respectively.

The voltage sensing units can measure a plurality of voltage parameters of the dual-wire power cable 2 disposed in the accommodating space; the voltage sensing units comprise two first electrode pairs, a second electrode pairs and a third electrode pairs. The first electrode pairs are disposed at the two substrates 12 respectively, and each first electrode pair is composed of two first electrodes 11a in order to measure the vertical-direction voltage $V_1$ of the dual-wire power cable 2. The second electrode pair is composed of two second electrodes 11b and the two second electrodes 11b are disposed at the two substrates 12 in order to measure the first horizontal-direction voltage $V_m$. The third electrode pair is composed of two third electrodes 11c, and the two third electrodes 11c are disposed at the two substrates 12 in order to measure the second horizontal-direction voltage $V_A$.

The iterative operation unit 13 is disposed on a circuit board 14 disposed inside the casing 10, and the iterative operation unit 13 is connected to the voltage sensing units. The iterative operation unit 13 can perform an iterative operation process according to a compensation database established by pre-measurement and the voltage parameters for compensating the horizontal displacement and the vertical displacement generated during the voltage sensor 1 being installed on the dual-wire power cable 2 in order to calculate the estimated input voltage of the dual-wire power cable 2.

As described above, the voltage sensing units can measure the voltage parameters of the dual-wire power cable 2, including the vertical-direction voltage $V_1$, the first horizontal-direction voltage $V_m$ and the second horizontal-direction voltage $V_A$. The aforementioned compensation database may comprise a plurality of compensation indicators, such as the horizontal displacement compensation indicator, the vertical displacement compensation indicator and the input voltage calibration indicator. The compensation database can be established by pre-measurement; that is to say, the pre-measurement is to input a predetermined input voltage into the dual-wire power cable 2 and measure the voltages of different positions (different vertical displacements and horizontal displacements) of the dual-wire power cable 2 to acquire the vertical-direction voltage $V_1$, the first horizontal-direction voltage $V_m$ and the second horizontal-direction voltage $V_A$. Accordingly, the horizontal displacement compensation indicator, the vertical displacement compensation indicator and the input voltage calibration indicator of the compensation database can provide the dual-wire power cable's voltage parameters, under a predetermined input voltage, measured by the voltage sensor 1 installed on the different positions (different vertical displacements and horizontal displacements) of the dual-wire power cable 2.

The iterative operation unit 13 can perform the iterative operation process. The iterative operation unit 13 uses an initial value of the vertical displacement and measured voltage parameters to calculate the estimated horizontal displacement according to the horizontal displacement compensation indicator in order to calibrate the error of the horizontal displacement. Next, the iterative operation unit 13 can use the above initial value and the estimated horizontal displacement to calculate the estimated input voltage according to the input voltage calibration indicator so as to calibrate the error of the input voltage; meanwhile, the iterative operation unit 13 determines whether the estimated input voltage conforms to the iterative termination condition; if the estimated input voltage conforms to the iterative termination condition, it means the estimated input voltage is very close to the real input voltage of the dual-wire power cable 2; next, the iterative operation unit 13 terminates the iterative operation process and outputs the estimated input voltage as the measurement result.

If the estimated input voltage fails to accord with the iterative termination condition, it means the estimated input voltage is not close to the real input voltage of the dual-wire power cable 2; then, the iterative operation unit 13 uses estimated horizontal displacement, the voltage parameters and the estimated input voltage to calculate the estimated vertical displacement according to the vertical displacement compensation indicator in order to calibrate the error of the vertical displacement. Afterward, the iterative operation unit 13 substitutes the estimated vertical displacement for the above initial value of the vertical displacement to recalculate the estimated horizontal displacement so as to calibrate the error of the horizontal displacement again; after that, the iterative operation unit 13 uses the above estimated vertical displacement and the estimated horizontal displacement to recalculate the estimated input voltage according to the input voltage calibration indicator in order to calibrate the error of the input voltage. Meanwhile, the iterative operation unit 13 determines whether the estimated input voltage tallies with the iterative termination condition again; if the estimated input voltage still fails to conform to the iterative termination condition, the iterative operation unit 13 will keep repeating the above iterative operation process until the estimated input voltage accords with the iterative termination condition.

According to the above description, by means of the iterative operation process, the iterative operation unit 13 can make the estimated horizontal displacement, estimated input voltage and the estimated vertical displacement gradually approach the real horizontal displacement, input voltage and vertical displacement of the voltage sensor 1 installing on the dual-wire power cable 2 for the purpose of acquiring the most accurate measurement result.

In the embodiment, the voltage parameters comprise the vertical-direction voltage $V_1$, the first horizontal-direction voltage $V_m$ and the second horizontal-direction voltage $V_A$; thus, the compensation database in the embodiment provides the horizontal displacement compensation indicator, the vertical displacement compensation indicator and the input voltage calibration indicator for the purpose of compensating the errors of the horizontal displacement, input voltage and vertical displacement respectively.

It is particularly noteworthy that each time the user manually installs the voltage sensor on a dual-wire power cable to be measured, the user cannot make sure the voltage sensor can be always installed on the same position because the installation position of the voltage sensor may vary with manual installation of the user; however, conventional voltage sensors cannot compensate the errors due to installation position variation caused by the user's manual installation. Accordingly, the conventional voltage sensors cannot achieve high accuracy. On the contrary, the non-contact type dual-wire power cable voltage sensor in accordance with the present invention can effectively compensate the vertical displacement and horizontal displacement generated during the voltage sensor being installed on the dual-wire power cable; therefore, the voltage sensor can measure the most accurate input voltage of the dual-wire power cable and achieve higher accuracy.

Figure 3:
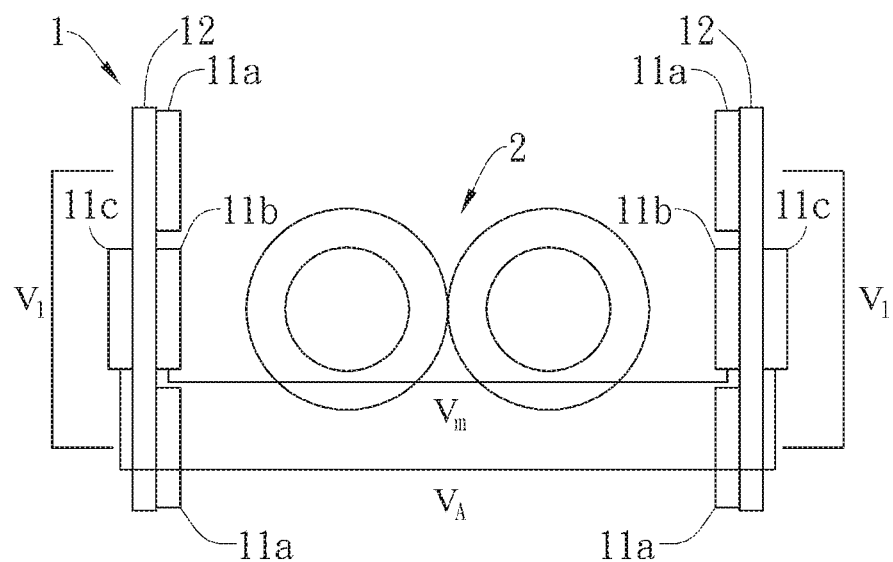
FIG. 3 is the third schematic view of the first embodiment of the non-contact type dual-wire power cable voltage sensor in accordance with the present invention.

Please refer to FIG. 2 and FIG. 3, which are the second and the third schematic views of the first embodiment of the non-contact type dual-wire power cable voltage sensor in accordance with the present invention. As shown in FIG. 2, the voltage sensor 1 comprises two substrates 12, a plurality of voltage sensing units and an iterative operation unit 13. When the voltage sensor 1 is used to measure the input voltage of the dual-wire power cable 2, the two substrates 12 are disposed at the two sides of the dual-wire power cable 2 respectively.

The voltage sensing units comprise two first electrode pairs, a second electrode pairs and a third electrode pairs. The first electrode pairs are disposed at the two substrates 12 respectively, and each first electrode pair is composed of two first electrodes 11a in order to measure the vertical-direction voltage $V_1$ of the dual-wire power cable 2. The second electrode pair is composed of two second electrodes 11b and the two second electrodes 11b are disposed at the two substrates 12 in order to measure the first horizontal-direction voltage $V_m$. The third electrode pair is composed of two third electrodes 11c, and the two third electrodes 11c are disposed at the two substrates 12 in order to measure the second horizontal-direction voltage $V_A$.

The iterative operation unit 13 can perform an iterative operation process according to a compensation database established by pre-measurement and the above voltage parameters. The compensation database further comprises the horizontal displacement compensation indicator, the vertical displacement compensation indicator and the input voltage calibration indicator. The correlations between the horizontal displacement g, vertical displacement w, vertical-direction voltage $V_1$, first horizontal-direction voltage $V_m$, second horizontal-direction voltage $V_A$ and the input voltage $V_{in}$ can be derived from the structures of FIGS. 2-3 and the theoretical model to establish the horizontal displacement compensation indicator, the vertical displacement compensation indicator and the input voltage calibration indicator respectively. The derivations of the above correlations are known by those skilled in the art and thus will not be described further herein.

The horizontal displacement indicator can provide the pre-measurement values of the vertical displacement g, the first horizontal-direction voltage $V_m$, and the second horizontal-direction voltage $V_A$ under different horizontal displacements g on the premise that a predetermined voltage is inputted into the dual-wire power cable 2. The input voltage calibration indicator can provide the pre-measurement values of the horizontal displacement g and the first horizontal-direction voltage $V_m$ under different vertical displacements w on the premise that the predetermined voltage is inputted into the dual-wire power cable 2. The vertical displacement compensation indicator can provide the pre-measurement values of the horizontal displacement g and the vertical-direction voltage $V_1$ under different vertical displacements w on the premise that the predetermined voltage is inputted into the dual-wire power cable 2.

According to FIG. 3, in the embodiment, the vertical direction can be the direction vertical to the arrangement direction of the two power cable, and the horizontal direction can be the direction parallel to the arrangement direction of the two power cable; the vertical displacement w can be the distance between the center of the substrate 12 and the horizontal cross section which passes through the centers of the two power cables; the horizontal displacement g can be the shortest distance between the substrate 12 and the dual-wire power cable 2.

As shown in FIG. 3, each time the user manually installs the voltage sensor 1 on the dual-wire power cable 2, the user cannot make sure the voltage sensor 1 can be always installed on the same position of the dual-wire power cable 2 because the installation position of the voltage sensor 1 may vary with manual installation of the user; therefore, the measurement result of the voltage sensor 1 will be influenced by the installation position variation (i.e. the vertical displacement w and the horizontal displacement g). In order to compensate the errors caused by the vertical displacement w and the horizontal displacement g, the iterative operation unit 13 will perform the iterative operation process. In the iterative operation process, the iterative operation unit 13 uses an initial value of the vertical displacement w, the measured first horizontal-direction voltage $V_m$ and the second horizontal-direction voltage $V_A$ to calculate the estimated horizontal displacement g according to the horizontal displacement compensation indicator; next, the iterative operation unit 13 uses the above initial value, the estimated horizontal displacement g and the measured first horizontal-direction voltage $V_m$ to calculate the estimated input voltage $V_{in}$ according to the input voltage calibration indicator; after that, if the estimated input voltage $V_{in}$ accords with the iterative termination condition, the iterative operation unit 13 outputs the estimated input voltage $V_{in}$ to serve as the measurement value; on the contrary, if the estimated input voltage $V_{in}$ fails to conform to the iterative termination condition, the iterative operation unit 13 will use the estimated horizontal displacement g, estimated input voltage $V_{in}$ and the vertical-direction voltage $V_1$ to calculate the vertical displacement w according to the vertical displacement compensation indicator, and then calculate the estimated horizontal displacement g according to the horizontal displacement compensation indicator again.

Therefore, during the iterative operation process, the iterative operation unit 13 will repeatedly calculate estimated values of the horizontal displacement g, input voltage $V_{in}$ and vertical displacement w in order to make their estimated values be gradually close to their real values. The iterative operation process will continue until the estimated input voltage $V_{in}$ conforms to the iterative termination condition, which can make the estimated input voltage as close as possible to the real value of the input voltage $V_{in}$ so as to increase the accuracy of the measurement.

Figure 4:
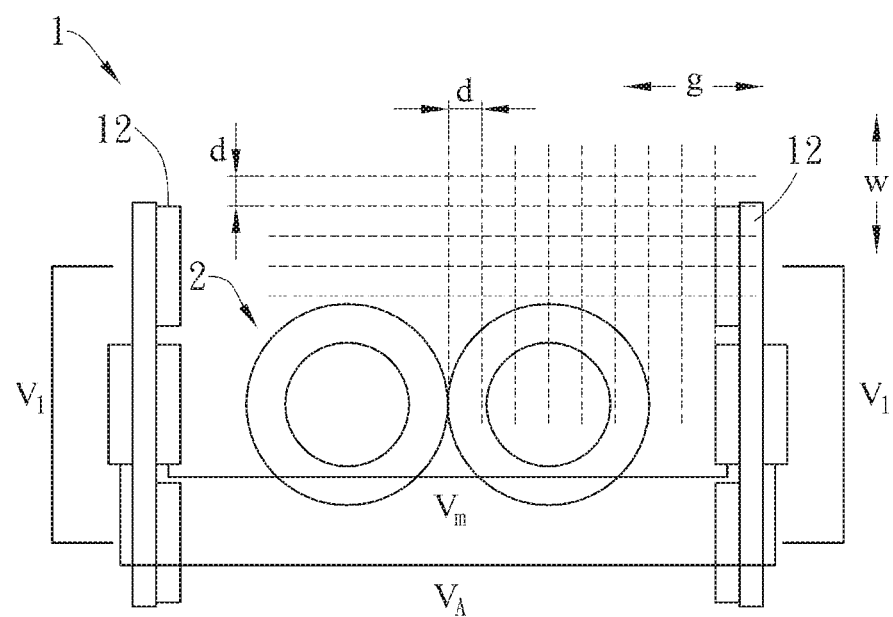
FIG. 4 is the schematic view of the pre-measurement method of the first embodiment of the non-contact type dual-wire power cable voltage sensor in accordance with the present invention.

In a preferred embodiment, the iterative termination condition of the iterative operation process can be $(V_{in,\,n} - V_{in,\,n-1})/V_{in,\,n} < 0.01$, where the $V_{in,\,n}$ is the estimated input voltage $V_{in}$ calculated by this iterative operation and the $V_{in,\,n-1}$ is the estimated input voltage $V_{in}$ calculated by last iterative operation. However, if the estimated input voltage $V_{in}$ fails to accord with the above condition but the number of the iterative operation has reached a predetermined value, the iterative operation process will also automatically terminate; in a preferred embodiment, the predetermined value can be 20 times. Please refer to FIG. 4, which is the schematic view of the pre-measurement method of the first embodiment of the non-contact type dual-wire power cable voltage sensor in accordance with the present invention. FIG. 4 shows the embodiment's pre-measurement method for establishing the horizontal displacement compensation indicator, the vertical displacement compensation indicator and the input voltage calibration indicator.

Figure 5:
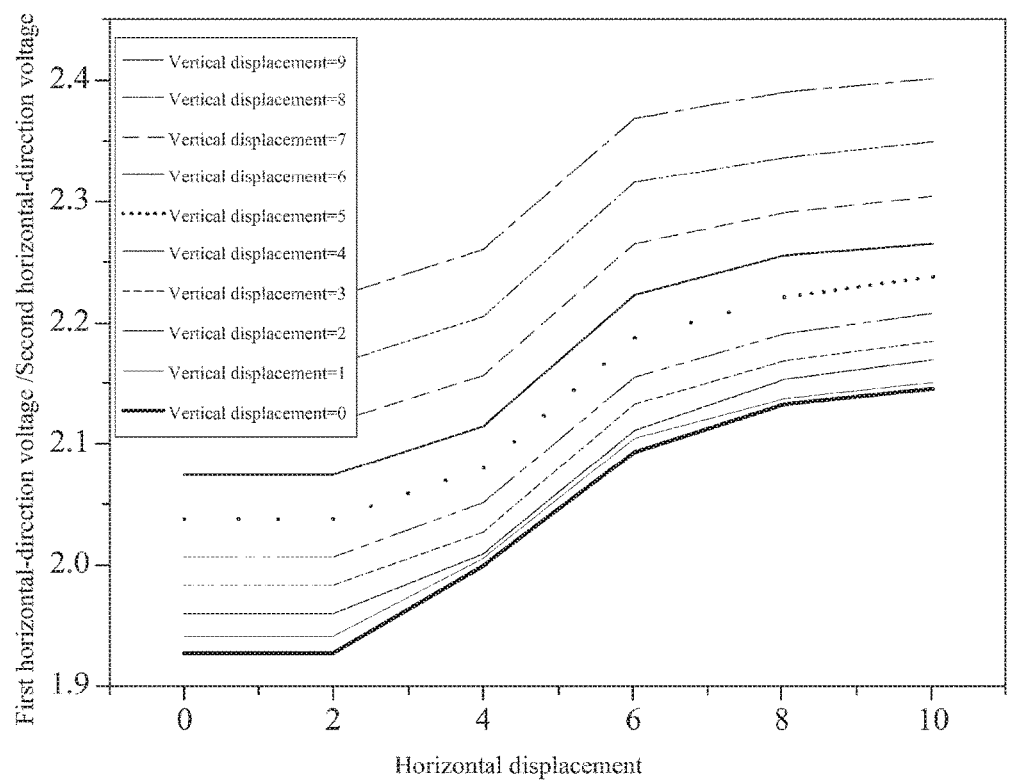
FIG. 5 is the schematic view of the horizontal displacement compensation indicator of the first embodiment of the non-contact type dual-wire power cable voltage sensor in accordance with the present invention.

The horizontal displacement compensation indicator can be expressed as $g=f_1(V_m/V_A, w)$, which shows the correlation between the horizontal displacement g, the vertical displacement w, the first horizontal-direction voltage $V_m$ and the second horizontal-direction voltage $V_A$. As shown in FIG. 4 and FIG. 5, in the embodiment, the horizontal displacement compensation indicator can be established by the pre-measurement; the pre-measurement is to measure the ratios $(V_m/V_A)$ of the first horizontal-direction voltage $V_m$ to the second horizontal-direction voltage $V_A$ under different horizontal displacement g displacements and multiple predetermined vertical displacement w (w=0, 2, 4, 6 . . . ) and then establish a curve diagram to serve as the horizontal displacement compensation indicator. The movement direction is as shown in FIG. 4, where the intersection points of the dotted lines are the measurement points and the displacement units d of both X-axis and Y-axis are 0.1 mm. The horizontal displacement compensation indicator of the embodiment is as shown in FIG. 5.

Figure 6:
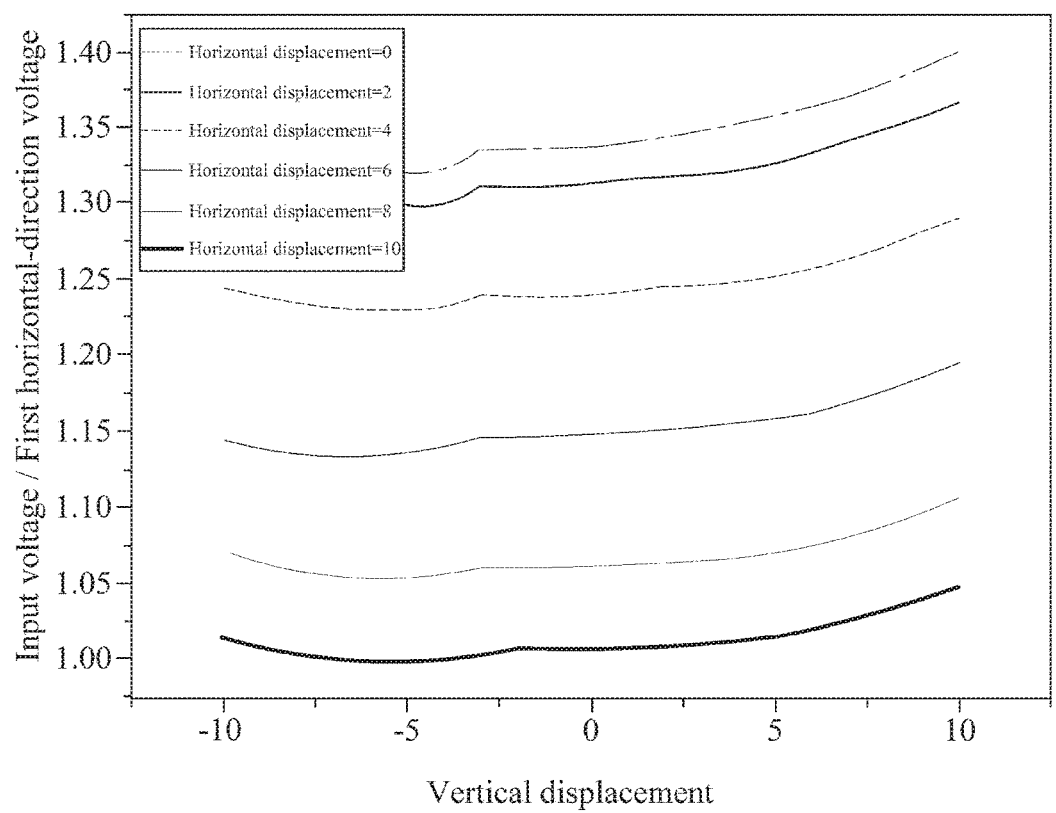
FIG. 6 is the schematic view of the input voltage calibration indicator of the first embodiment of the non-contact type dual-wire power cable voltage sensor in accordance with the present invention.

The input voltage calibration indicator can be established based on the voltage calibration factor $V_{in}/V_m=\text{Gain}=f_2(V_m/V_A, g)$, which shows the correlation between the horizontal displacement g, the input voltage $V_{in}$, the first horizontal-direction $V_m$ and the second horizontal-direction voltage $V_A$. As shown in FIG. 4 and FIG. 6, in the embodiment, the input voltage calibration indicator can be established by the pre-measurement; the pre-measurement is to measure the ratios $(V_{in}/V_m)$ of the predetermined input voltage $V_{in}$ to the measured first horizontal-direction voltage $V_m$ under different vertical displacements w and multiple predetermined horizontal displacement g (g=0, 2, 4, 6 . . . ) and then establish a curve diagram to serve as the input voltage calibration indicator. The movement direction is as shown in FIG. 4; similarly, both the horizontal distance and the vertical distance between any two adjacent measurement points are 0.1 mm. The input voltage calibration indicator of the embodiment is as shown in FIG. 6.

Figure 7:
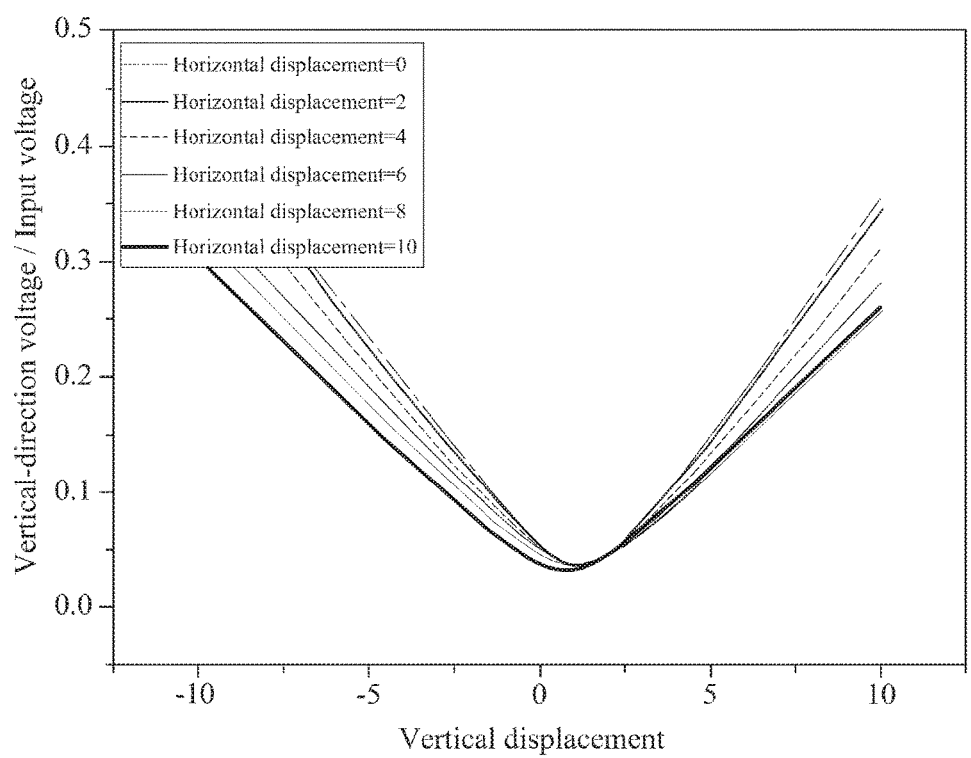
FIG. 7 is the schematic view of the vertical displacement compensation indicator of the first embodiment of the non-contact type dual-wire power cable voltage sensor in accordance with the present invention.

The vertical displacement compensation indicator can be expressed as $w=f_3(g, V_1/V_{in})$, which shows the correlation between the horizontal displacement g, the vertical displacement w, the vertical-direction voltage $V_1$ and the input voltage $V_{in}$. As shown in FIG. 4 and FIG. 7, in the embodiment, the vertical displacement compensation indicator can be established by the pre-measurement; the pre-measurement is to measure the ratios $(V_m/V_A)$ of the measured vertical-direction voltage $V_1$ to the predetermined input voltage $V_{in}$ (110V) under different vertical displacement w and multiple predetermined horizontal displacement g (g=0, 2, 4, 6 . . . ) and then establish a curve diagram to serve as the vertical displacement compensation indicator. The movement direction is as shown in FIG. 4; similarly, both the horizontal distance and the vertical distance between any two adjacent measurement points are 0.1 mm. The vertical displacement compensation indicator of the embodiment is as shown in FIG. 7. The aforementioned embodiment is just for example instead of limitation; the horizontal displacement compensation indicator, the vertical displacement compensation indicator and the input voltage calibration indicator according to the present invention can be other forms or established by other methods; the present invention is not limited to the above embodiment.

As shown in FIG. 2, when the user uses the voltage sensor 1 to measure the input voltage $V_{in}$ of the dual-wire power cable 2, the iterative operation unit 13 can use the initial value $w_1$ ($w_1=0$) of the vertical displacement w, the measured first horizontal-direction $V_m$ and second horizontal-direction $V_A$ to calculate the estimated horizontal displacement $g_1$ according to the horizontal displacement compensation indicator. Next, the iterative operation unit 13 use the estimated horizontal displacement $g_1$, the initial value $w_1$ of the vertical displacement w and the first horizontal-direction voltage $V_m$ to calculate the estimated input voltage $V_{in,\,1}$ according to the input voltage calibration indicator; meanwhile, the iterative operation unit 13 determines whether the estimated input voltage $V_{in,\,1}$ meets the iterative termination condition $(V_{in,\,n}-V_{in,\,n-1})/V_{in,\,n}<0.01$. If it does, the iterative operation unit 13 outputs the estimated input voltage $V_{in,\,1}$ to serve as the measurement result; if it does not, the iterative operation unit 13 uses the estimated horizontal displacement $g_1$, the estimated input voltage $V_{in,\,1}$ and the first horizontal-direction voltage $V_m$ to calculate the estimated vertical displacement $w_2$ according to the vertical displacement compensation indicator, and then use the estimated vertical displacement $w_2$ to recalculate the estimated horizontal displacement $g_2$ according to the horizontal displacement compensation indicator. Similarly, the iterative operation unit 13 use the estimated horizontal displacement $g_2$, the estimated vertical displacement $w_2$ and the first horizontal-direction voltage $V_m$ to calculate the estimated input voltage $V_{in,\,2}$ according to the input voltage calibration indicator; meanwhile, the iterative operation unit 13 determines whether the estimated input voltage $V_{in,\,2}$ meets the iterative termination condition $(V_{in,\,n}-V_{in,\,n-1})/V_{in,\,n}<0.01$. If it does, the iterative operation unit 13 outputs the estimated input voltage $V_{in,\,2}$ to serve as the measurement result; if it does not, the iterative operation unit 13 uses the estimated horizontal displacement $g_2$, the estimated input voltage $V_{in,\,2}$ and the first horizontal-direction voltage $V_m$ to calculate the estimated vertical displacement $w_3$ according to the vertical displacement compensation indicator, and repeats the above operation until the estimated input voltage $V_{in,\,n}$ conforms to the iterative termination condition $(V_{in,\,n}-V_{in,\,n-1})/V_{in,\,n}<0.01$. When the estimated input voltage $V_{in,\,n}$ meets the iterative termination condition, it means that the estimated horizontal displacement $g_n$, the estimated vertical displacement $w_n$ and the estimated input voltage $V_{in,\,n}$ are very close to the real vertical displacement and horizontal displacement generated during the voltage sensor 1 being installed on the dual-wire power cable 2 and the real input voltage of the dual-wire power cable 2; then, the voltage sensor 1 outputs the estimated input voltage $V_{in,\,n}$ to serve as the measurement result.

As shown in FIG. 3, as each time the user manually installs the voltage sensor 1 on a dual-wire power cable 2 to be measured, the user cannot make sure the vertical displacement w and the horizontal displacement g are always constant. However, in the embodiment, the errors caused by the vertical displacement w and the horizontal displacement g can be compensated by the aforementioned iterative operation process. The horizontal displacement g, the vertical displacement w and the estimated input voltage $V_{in}$ calculated by the repeatedly iterative operation will be gradually close to the real vertical displacement and horizontal displacement generated during the voltage sensor 1 being installed on the dual-wire power cable 2 and the real input voltage of the dual-wire power cable 2. Accordingly, the voltage sensor 1 of the embodiment can effectively compensate the errors due to the installation position variation caused by manual installation, so the accuracy of the voltage sensor 1 will be dramatically improved.

Figure 8:
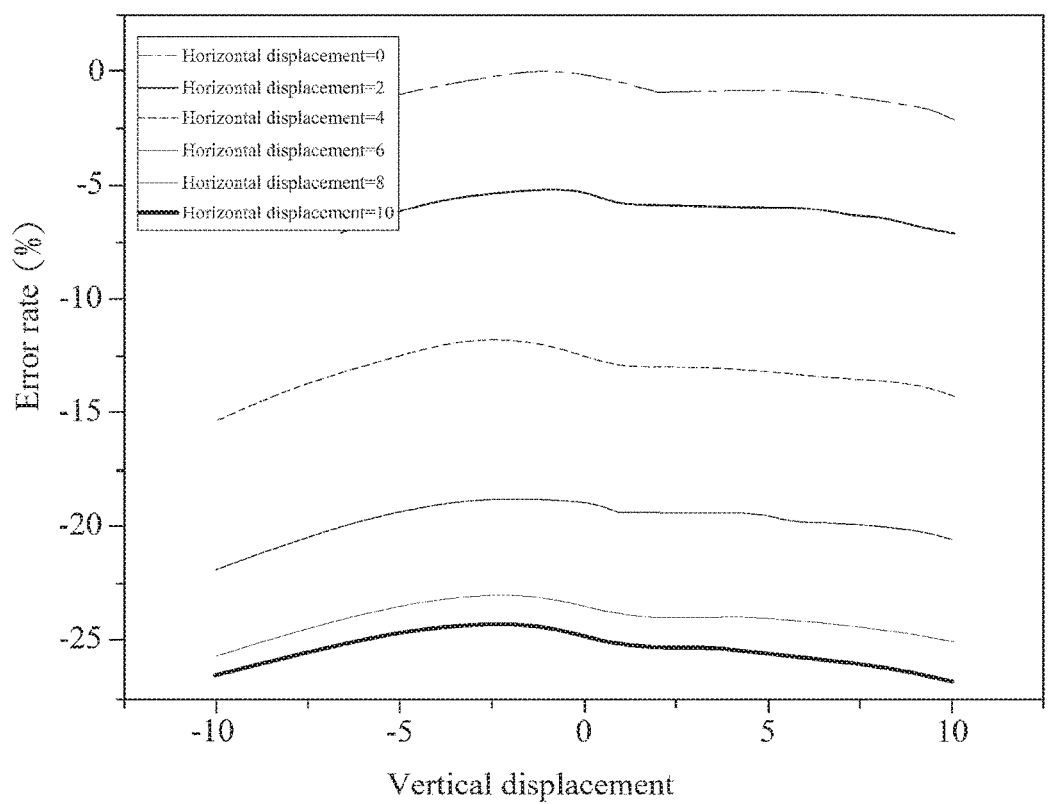
FIG. 8 is the error rate curve diagram of the voltage sensor not using the installation position variation compensation method of the first embodiment in accordance with the present invention.
Figure 9:
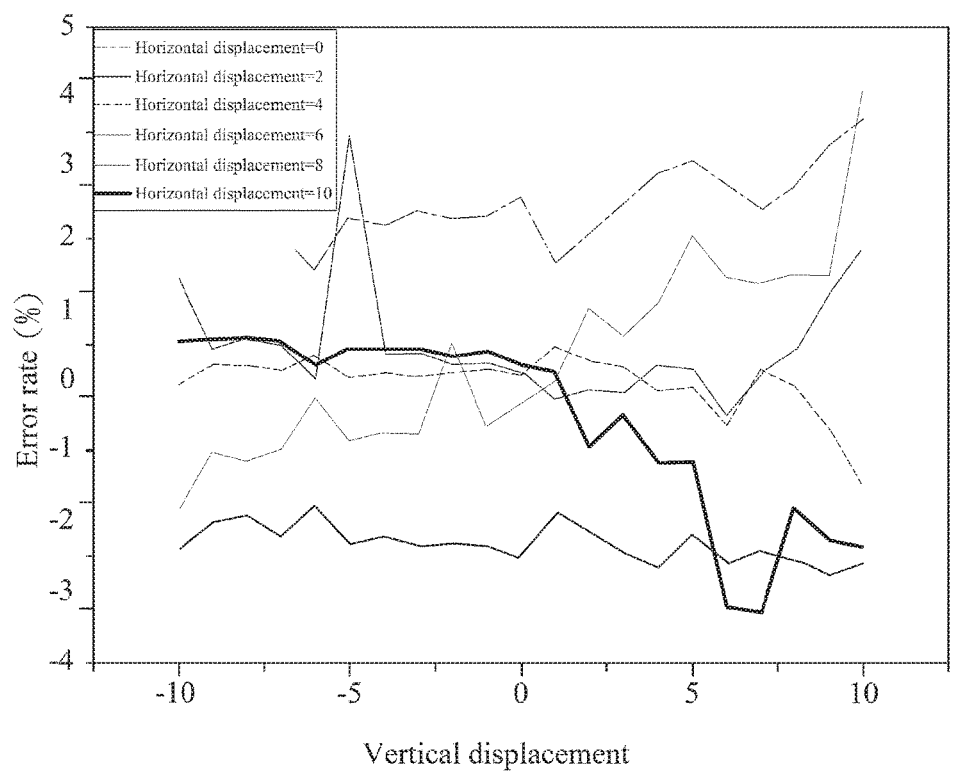
FIG. 9 is the error rate curve diagram of the voltage sensor using the installation position variation compensation method of the first embodiment in accordance with the present invention.

Please refer to FIG. 8 and FIG. 9. FIG. 8 is the error rate curve diagram of the voltage sensor not using the installation position variation compensation method of the first embodiment in accordance with the present invention; FIG. 9 is the error rate curve diagram of the voltage sensor using the installation position variation compensation method of the first embodiment in accordance with the present invention. As shown in FIG. 8 and FIG. 9, the error rate of the voltage sensor using the installation position variation compensation method is significantly improved; thus, it is obvious that the installation position variation compensation method of the present invention can definitely calibrate the errors due to the installation position variation caused by manual installation so as to make the measurement result of the voltage sensor as close as possible to the real input voltage of the dual-wire power cable, where the displacement units of both X-axis and Y-axis are 0.1 mm.

It is particularly noteworthy that conventional voltage sensors cannot provide effective calibration functions to compensate the errors due to the installation position variation caused by manual installation. On the contrary, the voltage sensor according to the preferred embodiment of the present invention can not only compensate the errors due to the installation position variation caused by manual installation, but also can use the measured voltage parameters to automatically execute the iterative operation process; therefore, the user does not have to manually operate the voltage sensor but can still acquire accurate measurement result.

Obviously, the voltage sensor according to the present invention can exactly improve the shortcomings of the conventional voltage sensors.

Figure 10:
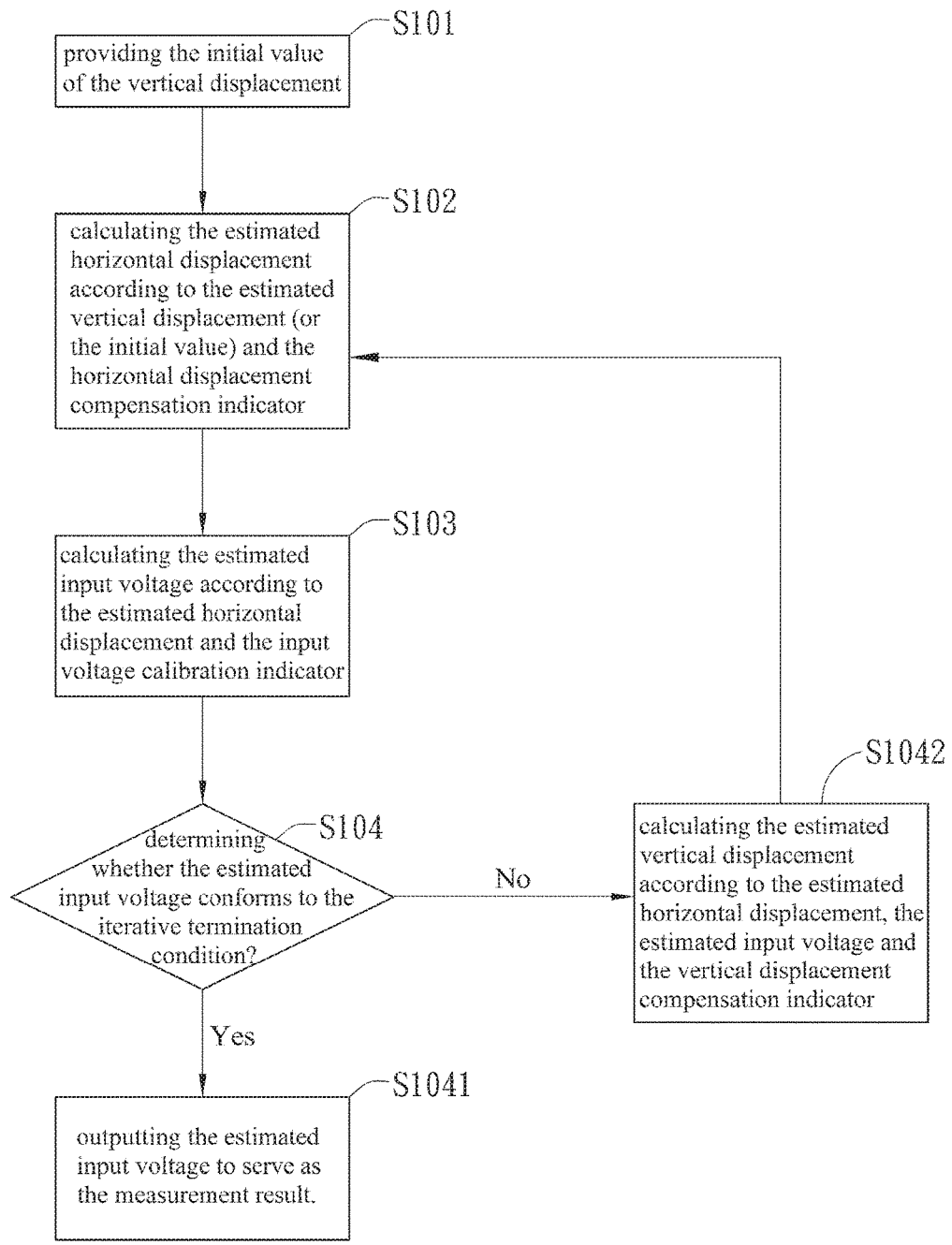
FIG. 10 is the flow chart of the first embodiment of the non-contact type dual-wire power cable voltage sensor in accordance with the present invention.

Please refer to FIG. 10, which is the flow chart of the first embodiment of the non-contact type dual-wire power cable voltage sensor in accordance with the present invention. The embodiment comprises the following steps:

In the step S101: providing the initial value of the vertical displacement.

In the step S102: calculating the estimated horizontal displacement according to the estimated vertical displacement (or the initial value) and the horizontal displacement compensation indicator.

In the step S103: calculating the estimated input voltage according to the estimated horizontal displacement and the input voltage calibration indicator.

In the step S104: determining whether the estimated input voltage conforms to the iterative termination condition? If it does, the next step is step S1040; if it does not, the next step is step S1042.

In the step S1041: outputting the estimated input voltage to serve as the measurement result.

In the step S1042: calculating the estimated vertical displacement according to the estimated horizontal displacement, the estimated input voltage and the vertical displacement compensation indicator, and returning to the step S102.

Although the above description about the non-contact type voltage sensor for dual-wire power cable in accordance with the present invention has illustrated the concept of the method for compensating voltage sensor installation position variation in accordance with the present invention, the following still provides the flow chart to specify the method for compensating voltage sensor installation position variation in accordance with the present invention.

Figure 11:
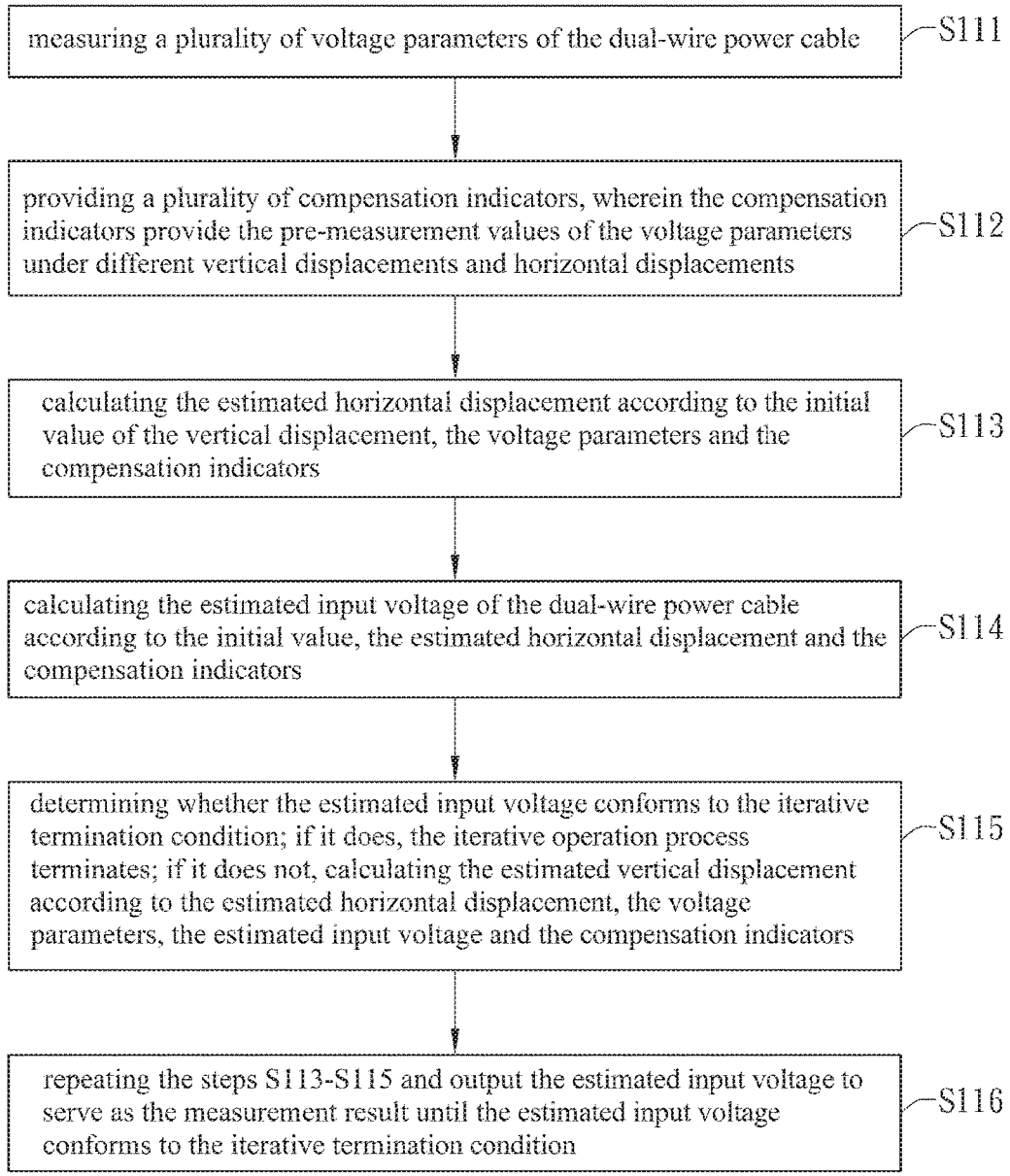
FIG. 11 is the flow chart of the method for compensating voltage sensor installation position variation in accordance with the present invention.

Please refer to FIG. 11, which is the flow chart of the method for compensating voltage sensor installation position variation in accordance with the present invention; the method may comprise the following steps:

In the step S111: measuring a plurality of voltage parameters of the dual-wire power cable.

In the step S112: providing a plurality of compensation indicators, wherein the compensation indicators provide the pre-measurement values of the voltage parameters under different vertical displacements and horizontal displacements.

In the step S113: calculating the estimated horizontal displacement according to the initial value of the vertical displacement, the voltage parameters and the compensation indicators.

In the step S114: calculating the estimated input voltage of the dual-wire power cable according to the initial value, the estimated horizontal displacement and the compensation indicators.

In the step S115: determining whether the estimated input voltage conforms to the iterative termination condition; if it does, the iterative operation process terminates; if it does not, calculating the estimated vertical displacement according to the estimated horizontal displacement, the voltage parameters, the estimated input voltage and the compensation indicators.

In the step S116: repeating the steps S113-S115 and output the estimated input voltage to serve as the measurement result until the estimated input voltage conforms to the iterative termination condition.

The detailed description and the exemplary embodiments of the method for compensating voltage sensor installation position variation in accordance with the present invention have been described in the description of the non-contact type voltage sensor for dual-wire power cable in accordance with the present invention; therefore, they will not be repeated herein again.

In summation of the description above, the voltage sensor according to one embodiment of the present invention can calculate the estimated input voltage closest to real input voltage of the dual-wire power cable via the iterative operation process; therefore, the errors due to the installation position variation caused by manual installation can be effectively compensated, so the voltage sensor can achieve "Install & Measure". Also, the voltage sensor according to one embodiment of the present invention can automatically calibrate the errors due to the installation position variation caused by manual installation; therefore, users do not have to manually calibrate the errors, which is more convenient for the users. Further, the voltage sensor according to one embodiment of the present invention can use the iterative operation process to calculate the estimated input voltage of the dual-wire power cable according to an iterative termination condition in order to make the estimated input voltage as close as possible to the real input voltage of the dual-wire power cable; in this way, the accuracy of the voltage sensor can be effectively enhanced.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A voltage sensor, comprising:
  a casing, comprising two grooves disposed on one side of the casing;
  two substrates, disposed on the grooves respectively, and an accommodating space being formed between the substrates;
  a plurality of voltage sensing units, disposed on the substrates for measuring a plurality of voltage parameters of a dual-wire power cable disposed in the accommodating space; and
  an iterative operation unit, disposed in the casing and connected to the voltage sensing units, wherein the iterative operation unit can perform an iterative operation process according to a compensation database and the voltage parameters for compensating a horizontal displacement and a vertical displacement generated during the voltage sensor being installed on the dual-wire power cable in order to calculate an estimated input voltage of the dual-wire power cable.

2. The voltage sensor of claim 1, further comprising a circuit board disposed in the casing, wherein, the iterative operation unit is disposed on the circuit board and connected to the voltage sensing units via the circuit board.

3. The voltage sensor of claim 1, wherein the grooves are arranged to be parallel to each other.

4. The voltage sensor of claim 3, wherein the casing further comprises two positioning bumps disposed on one side of the grooves respectively, and the substrates lean against the positioning bumps respectively.

5. The voltage sensor of claim 1, wherein the voltage sensing units comprise two first electrode pairs disposed on the substrates respectively in order to measure a vertical-direction voltage.

6. The voltage sensor of claim 5, wherein the voltage sensing units further comprise a second electrode pair, electrodes of the second electrode pair are disposed on the substrates respectively in order to measure a first horizontal-direction voltage.

7. The voltage sensor of claim 6, wherein the voltage sensing units further comprise a third electrode pair, electrodes of the third electrode pair are disposed on the substrates respectively in order to measure a second horizontal-direction voltage.

8. The voltage sensor of claim 1, wherein the horizontal displacement is a shortest distance between the substrates and the dual-wire power cable.

9. The voltage sensor of claim 1, wherein the vertical displacement is a distance between the substrates and a central horizontal cross-section of the dual-wire power cable.

* * * * *